US008566674B2

(12) United States Patent
Parkinson

(10) Patent No.: US 8,566,674 B2
(45) Date of Patent: Oct. 22, 2013

(54) USING A PHASE CHANGE MEMORY AS A HIGH VOLUME MEMORY

(75) Inventor: Ward D. Parkinson, Boise, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 573 days.

(21) Appl. No.: 12/538,906

(22) Filed: Aug. 11, 2009

(65) Prior Publication Data

US 2009/0300467 A1  Dec. 3, 2009

Related U.S. Application Data

(62) Division of application No. 10/939,273, filed on Sep. 10, 2004, now Pat. No. 7,590,918.

(51) Int. Cl.
*G11C 29/00* (2006.01)
*H03M 13/00* (2006.01)

(52) U.S. Cl.
USPC ........................................... 714/773; 714/763

(58) Field of Classification Search
USPC .................................................. 714/773, 763
See application file for complete search history.

(56) References Cited

U.S. PATENT DOCUMENTS

| | | | | |
|---|---|---|---|---|
| 3,735,105 A * | 5/1973 | Maley | ............................ | 714/772 |
| 4,216,541 A * | 8/1980 | Clover et al. | ................. | 714/764 |
| 5,450,576 A * | 9/1995 | Kennedy | ............................ | 713/2 |
| 5,546,410 A * | 8/1996 | Ando et al. | ..................... | 714/764 |
| 5,714,768 A * | 2/1998 | Ovshinsky et al. | ............. | 257/40 |
| 5,732,092 A * | 3/1998 | Shinohara | ..................... | 714/764 |
| 5,848,076 A * | 12/1998 | Yoshimura | .................... | 714/763 |
| 6,041,001 A * | 3/2000 | Estakhri | ........................ | 365/200 |
| 6,055,665 A * | 4/2000 | Branchetti et al. | ............ | 714/777 |
| 6,061,824 A * | 5/2000 | Mo et al. | ........................ | 714/769 |
| 6,314,068 B1 * | 11/2001 | Sano et al. | ................. | 369/44.32 |
| 6,327,231 B1 * | 12/2001 | Sano et al. | ................. | 369/44.23 |
| 6,469,931 B1 * | 10/2002 | Ban et al. | ................. | 365/185.08 |
| 6,697,992 B2 * | 2/2004 | Ito et al. | ........................ | 714/763 |
| 6,741,502 B1 * | 5/2004 | Cernea | ..................... | 365/185.29 |
| 6,795,362 B2 * | 9/2004 | Nakai et al. | ..................... | 365/222 |
| 6,899,938 B2 * | 5/2005 | Flynn | ........................... | 428/64.5 |
| 6,948,098 B2 * | 9/2005 | Pillay et al. | ..................... | 714/34 |
| 6,956,779 B2 * | 10/2005 | Tran | ............................. | 365/205 |
| 6,975,539 B2 * | 12/2005 | Tran | ........................... | 365/185.2 |
| 7,009,208 B2 * | 3/2006 | Aratani et al. | ................. | 257/74 |
| 7,031,214 B2 * | 4/2006 | Tran | ......................... | 365/185.11 |
| 7,035,987 B2 * | 4/2006 | Rudelic | ........................ | 711/170 |
| 7,120,729 B2 * | 10/2006 | Gonzalez et al. | ............ | 711/103 |
| 7,139,196 B2 * | 11/2006 | Tran | ......................... | 365/185.21 |
| 7,144,241 B2 * | 12/2006 | Hennessey et al. | ........... | 425/363 |
| 7,149,110 B2 * | 12/2006 | Tran et al. | ................. | 365/185.03 |
| 7,191,379 B2 * | 3/2007 | Adelmann et al. | ............ | 714/758 |
| 7,590,918 B2 * | 9/2009 | Parkinson | ..................... | 714/763 |
| 7,782,731 B2 * | 8/2010 | Henrichs | ........................ | 369/95 |
| 2003/0115507 A1* | 6/2003 | Kuroiwa et al. | ................ | 714/42 |
| 2003/0161245 A1* | 8/2003 | Henrichs | ......................... | 369/95 |
| 2003/0234449 A1* | 12/2003 | Aratani et al. | ................ | 257/758 |
| 2004/0083335 A1* | 4/2004 | Gonzalez et al. | ............ | 711/103 |
| 2004/0168101 A1* | 8/2004 | Kubo | ................................ | 714/6 |
| 2005/0023656 A1* | 2/2005 | Leedy | ........................... | 257/678 |
| 2005/0120265 A1* | 6/2005 | Pline et al. | ........................ | 714/7 |
| 2006/0020744 A1* | 1/2006 | Sinclair et al. | ................ | 711/103 |
| 2006/0059405 A1* | 3/2006 | Parkinson | ..................... | 714/763 |

* cited by examiner

*Primary Examiner* — Joseph D Torres
(74) *Attorney, Agent, or Firm* — Trop, Pruner & Hu, P.C.

(57) ABSTRACT

A phase change memory may be utilized in place of more conventional, higher volume memories such as static random access memory, flash memory, or dynamic random access memory. To account for the fact that the phase change memory is not yet a high volume technology, an error correcting code may be incorporated. The error correcting code may be utilized in ways which do not severely negatively impact read access times, in some embodiments.

5 Claims, 5 Drawing Sheets

USING A PHASE CHANGE MEMORY AS A HIGH VOLUME MEMORY

CROSS-REFERENCE TO RELATED APPLICATIONS

This application is a divisional of U.S. patent application Ser. No. 10/939,273, filed on Sep. 10, 2004 now U.S. Pat. No. 7,590,918.

BACKGROUND

This invention relates generally to processor-based systems.

Processor-based systems may include any device with a specialized or general purpose processor. Examples of such systems include personal computers, laptop computers, personal digital assistants, cell phones, cameras, web tablets, electronic games, and media devices, such as digital versatile disk players, to mention a few examples.

Conventionally, such devices use either semiconductor memory, hard disk drives, or some combination of the two as storage. One common semiconductor memory is a dynamic random access memory (DRAM). A DRAM is a volatile memory. Without refreshing or after power is removed or lost, it does not maintain the information stored thereon. Thus, DRAMs may be utilized as relatively fast storage that operates with microprocessors. One typical application of DRAM is in connection with system memory.

Conventionally, a processor-based system included a variety of different memories or storages. Examples of such systems include hard disk drives, static random access memory, and dynamic random access memory. The more memories that must be plugged into the processor-based system, the more space that is required. Moreover, the more memories that are required, the more overhead that is associated with maintaining those various memories.

In many processor-based systems, especially in embedded applications, it is desirable to implement the systems as cost effectively as possible. Moreover, in a variety of applications, including embedded applications, it may be desirable to implement the systems in the smallest possible size that is possible.

Thus, there is a need for improved processor-based systems.

DETAILED DESCRIPTION

Figure 1:
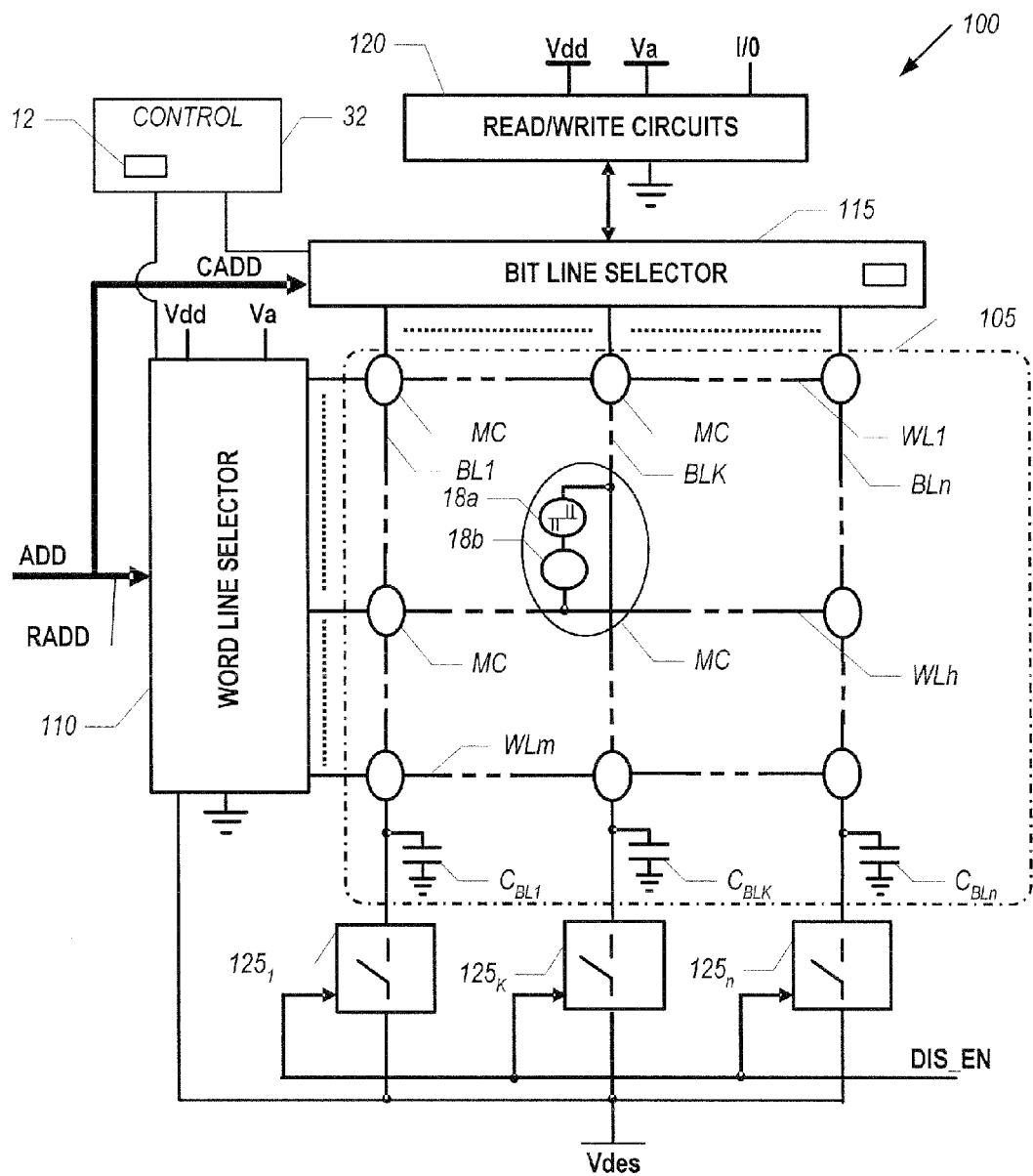
FIG. 1 is a schematic depiction of a portion of an array in one embodiment of the present invention.

Referring to FIG. 1, in one embodiment, a memory 100 may include an array of memory cells MC arranged in rows WL and columns BL in accordance with one embodiment of the present invention. While a relatively small array is illustrated, the present invention is in no way limited to any particular size of an array. While the terms "rows," "word lines," "bit lines," and "columns" are used herein, they are merely meant to be illustrative and are not limiting with respect to the type and style of the sensed array.

The memory device 100 includes a plurality of memory cells MC typically arranged in a matrix 105. The memory cells MC in the matrix 105 may be arranged in m rows and n columns with a word line WL1-WLm associated with each matrix row, and a bit line BL1-BLn associated with each matrix column.

The memory device 100, in one embodiment, may also include a number of auxiliary lines including a supply voltage line Vdd, distributing a supply voltage Vdd through a chip including the memory device 100, that, depending on the specific memory device embodiment, may be, typically, from 1 to 3 V, for example 1.8 V, and a ground voltage line GND distributing a ground voltage. A high voltage supply line Va may provide a relatively high voltage, generated by devices (e.g. charge-pump voltage boosters not shown in the drawing) integrated on the same chip, or externally supplied to the memory device 100. For example, the high voltage Va may be 4.5-5 V in one embodiment.

The cell MC may be any memory cell including a phase change memory cell. Examples of phase change memory cells include those using chalcogenide memory element 18a and an access, select, or threshold device 18b coupled in series to the device 18a. The threshold device 18b may be an ovonic threshold switch that can be made of a chalcogenide alloy that does not exhibit an amorphous to crystalline phase change and which undergoes a rapid, electric field initiated change in electrical conductivity that persists only so long as a holding voltage is present.

A memory cell MC in the matrix 105 is connected to a respective one of the word lines WL1-WLm and a respective one of the bit lines BL1-BLn. In particular, the storage element 18a may have a first terminal connected to the respective bit line BL1-BLn and a second terminal connected to a first terminal of the associated device 18b. The device 18b may have a second terminal connected to a word line WL1-WLm. Alternatively, the storage element 18a may be connected to the respective word line WL1-WLm and the device 18b, associated with the storage element 18a, may be connected to the respective bit line BL1-BLn.

A memory cell MC within the matrix 105 is accessed by selecting the corresponding row and column pair, i.e. by selecting the corresponding word line and bit line pair. Word line selector circuits 110 and bit line selector circuits 115 may perform the selection of the word lines and of the bit lines on the basis of a row address binary code RADD and a column address binary code CADD, respectively, part of a memory address binary code ADD, for example received by the memory device 100 from a device external to the memory (e.g., a microprocessor). The word line selector circuits 110 may decode the row address code RADD and select a corresponding one of the word lines WL1-WLm, identified by the specific row address code RADD received. The bit line selector circuits 115 may decode the column address code CADD and select a corresponding bit line or, more generally, a corresponding bit line packet of the bit lines BL1-BLn. For example, the number of selected bit lines depending on the number of data words that can be read during a burst reading operation on the memory device 100. A bit line BL1-BLn may be identified by the received specific column address code CADD.

The bit line selector circuits 115 interface with read/write circuits 120. The read/write circuits 120 enable the writing of desired logic values into the selected memory cells MC, and reading of the logic values currently stored therein. For example, the read/write circuits 120 include sense amplifiers together with comparators, reference current/voltage generators, and current pulse generators for writing and reading the logic values stored in the memory cells MC.

In one embodiment, in a stand-by operating condition, as well as before any read or write access to the memory device 100, the word line selection circuits 110 may keep the word lines WL1-WLm at a relatively high de-selection voltage Vdes (e.g., a voltage roughly equal to half the high voltage Va (Va/2)). At the same time, the bit line selection circuits 115 may keep the bit lines BL1-BLn disconnected, and thus isolated, from the read/write circuits 120 or, alternatively, at the relatively low de-selection voltage Vdes. In this way, none of the memory cells MC is accessed, since the bit lines BL1-BLn are floating or a voltage approximately equal to zero is dropped across the access elements 18b, so the deselected row and column lines are at about the same voltage. Spare (redundant) rows and columns may be provided and used with a selection means to replace bad rows, bits, and columns by techniques familiar to those reasonably skilled in the art.

During a reading or a writing operation, the word line selection circuits 110 may lower (or raise if an MOS transistor select device is used) the voltage of a selected one of the word lines WL1-WLm to a word line selection voltage $V_{WL}$ (for example, having a value equal to 0V—the ground potential if a bipolar diode or a chalcogenide select device (such as an ovonic threshold switch) is used), while the remaining word lines may be kept at the word line de-selection voltage Vdes in one embodiment. Similarly, the bit line selection circuits 115 may couple a selected one of the bit lines BL1-BLn (more typically, a selected bit line packet) to the read/write circuits 120, while the remaining, non-selected bit lines may be left floating or held at the de-selection voltage, Vdes. Typically, when the memory device 100 is accessed, the read/write circuits 120 force a suitable current pulse into each selected bit line BL1-BLn. The pulse amplitude depends on the reading or writing operations to be performed.

In particular, during a reading operation a relatively low current pulse (compared to write current pulse magnitude) is applied to each selected bit line in one embodiment. The read current pulse may have a suitable amplitude and a suitable time duration. The read current causes the charging of stray capacitances $C_{BL1}$-$C_{BLn}$ (typically, of about 1 pF), intrinsically associated with the parasitic bit lines BL1-BLn and column drive circuitry, and, accordingly, a corresponding transient of a bit line voltage $V_{BL}$ at each selected bit line BL1-BLn. When the read current is forced into each selected bit line BL1-BLn, the respective bit line voltage raises towards a corresponding steady-state value, depending on the resistance of the storage element 18a, i.e., on the logic value stored in the selected memory cell MC. The duration of the transient depends on the state of the storage element 18a. If the storage element 18a is in the crystalline state and the threshold device 18b is switched on, a cell current flowing through the selected memory cell MC when the column is forced to a voltage has an amplitude lower than the amplitude in the case where the storage element 18a is in the higher resistivity or reset state, and the resulting voltage on the column line when a constant current is forced is lower for a set state relative to reset state.

The logic value stored in the memory cell MC may, in one embodiment, be evaluated by means of a comparison of the bit line voltage (or another voltage related to the bit line voltage) at, or close to, the steady state thereof with a suitable reference voltage, for example, obtained exploiting a service reference memory cell in an intermediate state or its equivalent. The reference voltage can, for example, be chosen to be an intermediate value between the bit line voltage when a logic value "0" is stored and the bit line voltage when a logic value "1" is stored.

In order to avoid spurious reading of the memory cells MC or to properly terminate the write cycle, the bit line stray capacitances $C_{BL1}$-$C_{BLn}$ may be discharged before performing a read operation. To this purpose, bit line discharge circuits $125_1$-$125_n$ are provided, associated with the bit lines BL1-BLn. The bit line discharge circuits $125_1$-$125_n$ may be enabled in a bit line discharge phase of the memory device operation, preceding and after any operation, for discharging the bit line stray capacitances $C_{BL1}$-$C_{BLn}$, in one embodiment.

The bit line discharge circuits $125_1$-$125_n$ may be implemented by means of transistors, particularly N-channel MOSFETs having a drain terminal connected to the corresponding bit line BL1-BLn, a source terminal connected to a de-selection voltage supply line Vdes providing the de-selection voltage Vdes and a gate terminal controlled by a discharge enable signal DIS_EN in one embodiment. Before starting a writing or a reading operation, the discharge enable signal DIS_EN may be temporarily asserted to a sufficiently high positive voltage, so that all the discharge MOSFETs turn on and connect the bit lines BL1-BLn to the de-selection voltage supply line Vdes. The discharge currents that flow through the discharge transistors cause the discharge of the bit line stray capacitances $C_{BL1}$-$C_{BLn}$ for reaching the de-selection voltage Vdes. Then, before selecting the desired word line WL1-WLm, the discharge enable signal DIS_EN is de-asserted and the discharge MOSFETs turned off. Similarly, to minimize access delay, the selected row and column lines may be respectively pre-charged to an appropriate safe starting voltage for selection and read or write operation. For example, the row line may be precharged to zero volts while the column if forced to a voltage slightly less than minimum threshold voltage of the OTS.

Figure 2:
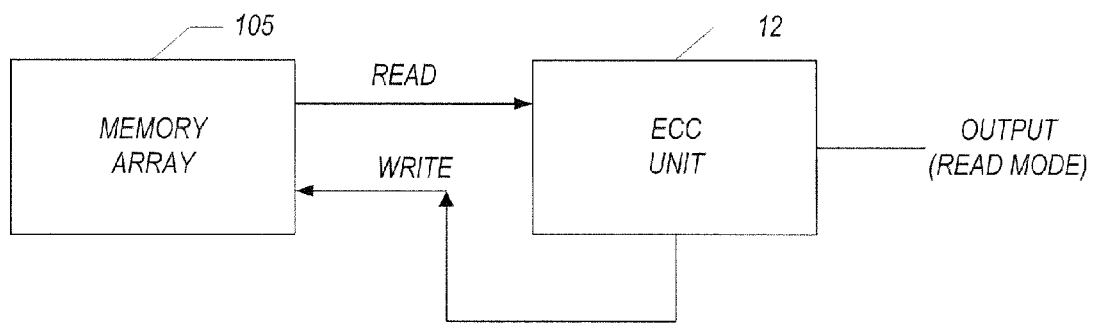
FIG. 2 is a schematic depiction of one embodiment of the present invention.

Referring to FIG. 2, in accordance with one embodiment of the present invention, the memory array 105 may schematically interact with an error correcting code unit 12. The error correcting code unit 12 may be in the form of hardware, software, or firmware. The unit 12 may be part of an integrated circuit that includes the memory 100 or may be separate therefrom. In one embodiment, the unit 12 may be part of a control 32, shown in FIG. 1. The control 32 may be a hardware or software based system which controls the memory 100, including reading, writing, and the like.

Whenever data is read from the memory array 105, it may be analyzed by the error correcting unit 12. In one embodiment, the unit 12 may implement Hamming code 3 bit detect, 2 bit correct, error correcting code using a wide (e.g., 64 bit) word. However, other error correcting codes may also be utilized, such as fire codes or majority voting (three physical bits for each logical bit).

Thus, in some embodiments of the present invention, the newer phase change memory technology may be utilized in place of what otherwise would be a high volume memory such as a dynamic random access memory, a static random access memory, a flash memory, or an optical or magnetic memory, such as a disk drive. Such an environment may include use in a variety of processor-based systems which are widely distributed, including personal computers, laptop computers, cameras, games, personal digital assistants, and cellular telephones, to mention a few examples. To the extent that the phase change memory is less reliable than needed or compared to other pre-existing, high volume memories, this can be at least partially compensated for by using the error correcting code unit 12.

In some embodiments, the use of the error correcting code may have a relatively small impact on read speed. In some embodiments, the implementation of the error correcting code may be optimized so as to have less impact on read speed, for example, by performing the code corrections during times which would not severely impact the read access time of the memory 100.

Thus, in some embodiments, the error correcting code unit 12 may determine that bits are not properly being read or written. If so, the error correcting code unit 12 can cause a correction to rewrite the memory array 105 as necessary to be sure that the correct information is being written. Thus, after a read operation, the error correcting code 12 can simply read the data that has been stored in the memory 105 and correct the data (if necessary) in the flow to the output pin. It may, for example, use error correcting code analysis techniques such as Hamming code. If corrections are necessary, those corrections may be implemented in the flow to the output pin, but the necessary write-back to the memory array may be by an appropriate write cycle at that time or at a later time which may reduce the impact of such a write cycle on read access times, or, never, by relying on a relatively low failure rate before the byte is re-written.

Figure 3:
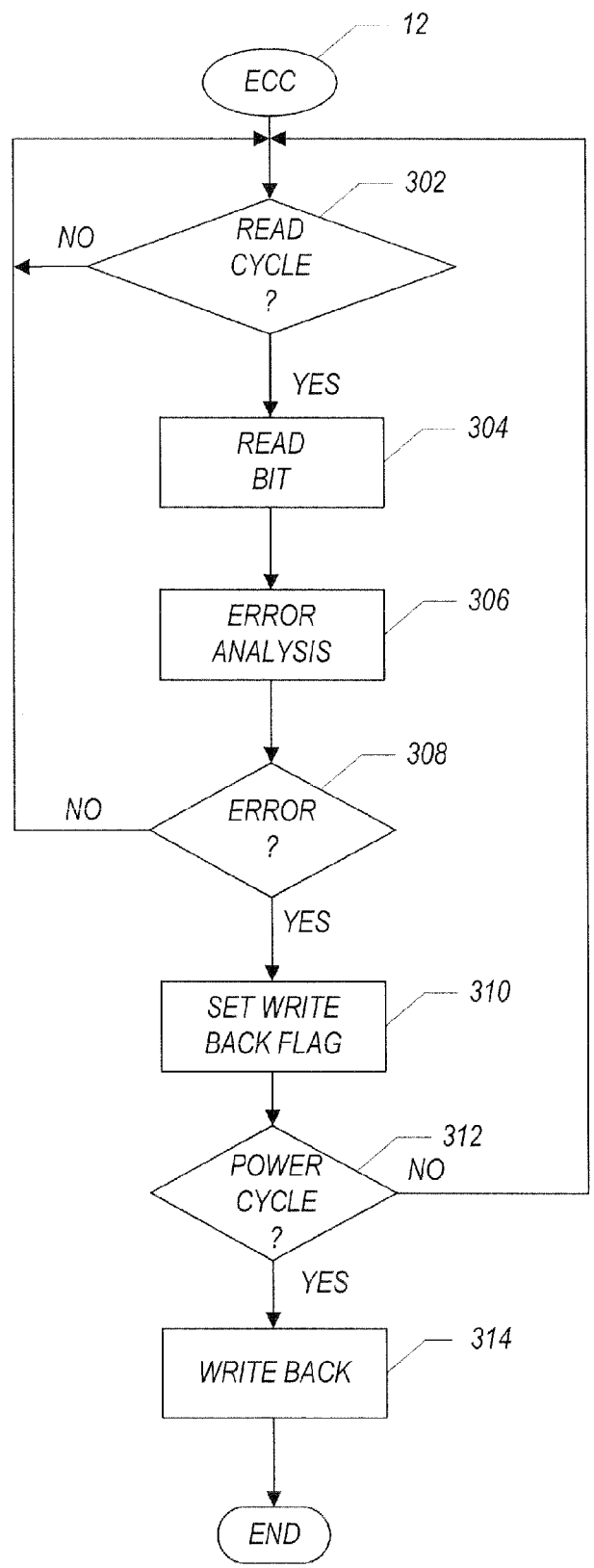
FIG. 3 is a flow chart for one embodiment of the present invention.

Referring to FIG. 3, in accordance with one embodiment of the present invention, the error correcting code 12 may initially determine (diamond 302) whether a read cycle has been requested to the memory array 105. If so, the bit may be read as indicated in block 304. An error analysis may be implemented as indicated in block 306. If an error has occurred in writing the data, as determined in diamond 308, a write back flag may be set as indicated in block 310. Then, when a power-down or power-up cycle, for example, occurs, as determined in diamond 312, the data may be written back as indicated in block 314. This can be done by reading the block and correcting any bytes found to have a bit or bits needed correction.

An article comprising a medium storing instructions that, if executed, enable a processor-based system to identify an error in data read by a phase change memory. The article further storing instructions that, if executed, enable the processor-based system to correct an incorrect bit by writing back a correct bit. The article of further storing instructions that, if executed, enable the processor-based system to wait until a power cycle to write back a corrected bit. The article further storing instructions that, if executed, enable the processor-based system to executed error correcting code. The article further storing instructions that, if executed, enable the processor-based system to identify errors using a Hamming code.

In some embodiments, the impact on read speed of the write back may be relatively small. However, the write back can be done in a read-modified-write cycle (RMW), extending the read cycle time to that of the slower write cycle, plus the read time, while maintaining good read access time to the output since the logical delays to correct the byte sent to the output pads is modest (compared to the read access time). Or, the write back may be done in a scrub mode, such as at power down or power up, to reduce the impact on cycle time. With Hamming code, either immediate write back correction or a scrub may be done. A scrub writes back later to reduce the impact on cycle time. However, later writeback will require reading the block and correcting bytes in error at that time.

Figure 4:
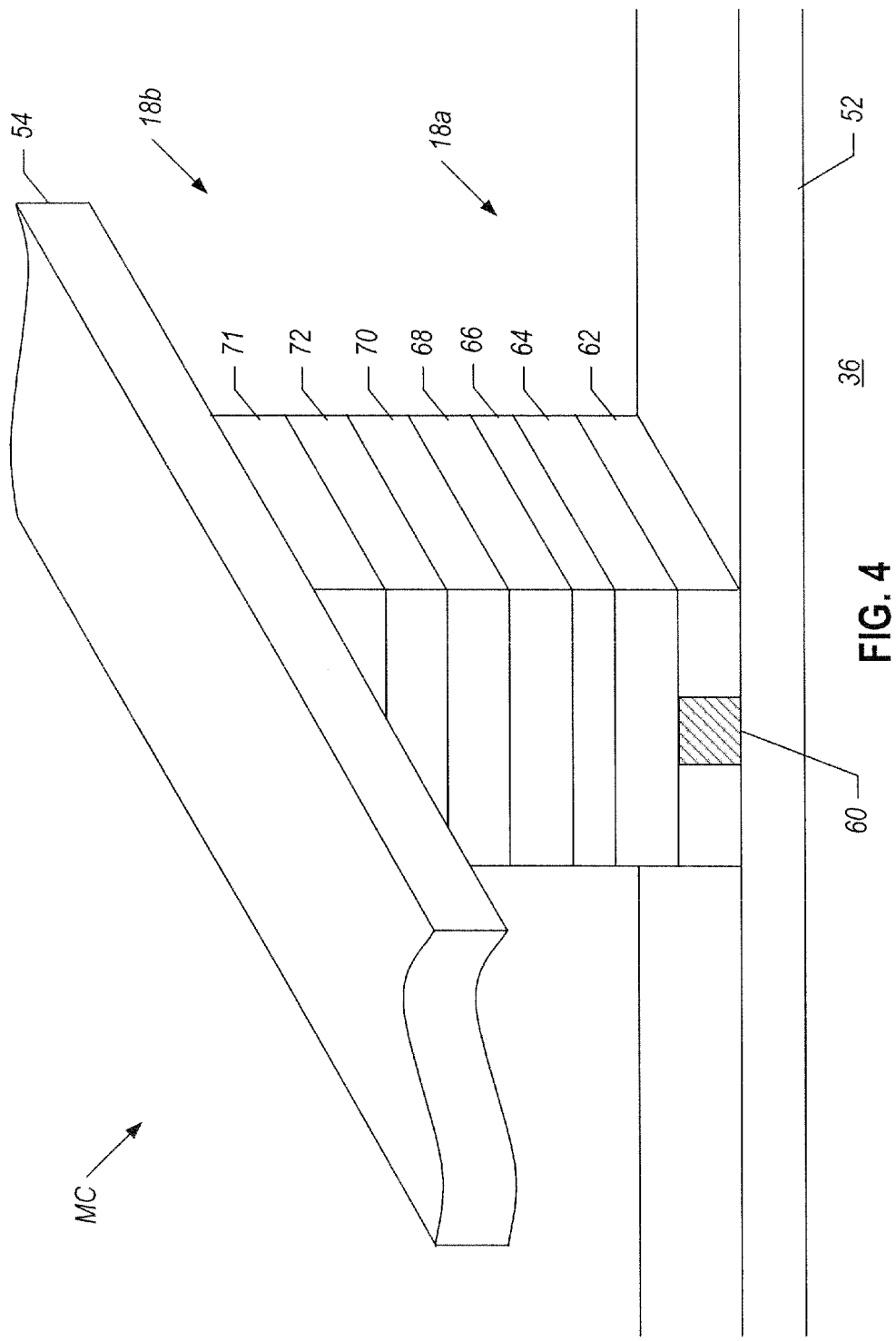
FIG. 4 is a schematic and cross-sectional view of a cell in accordance with one embodiment of the present invention.

Referring to FIG. 4, a cell MC in the array 105 may be formed over a substrate 36. The substrate 36, in one embodiment, may include the conductive word line 52 coupled to a selection device 18b. The selection device 18b, in one embodiment, may be formed in the substrate 36 and may, for example, be a diode, transistor, or a non-programmable chalcogenide selection device formed as a thin film alloy above the substrate.

The selection device 18b may be formed of a non-programmable chalcogenide material including a top electrode 71, a chalcogenide material 72, and a bottom electrode 70. The selection device 18b may be permanently in the reset state in one embodiment. While an embodiment is illustrated in which the selection device 18b is positioned over the phase change memory element 18a, the opposite orientation may be used as well.

Conversely, the phase change memory element 18a may be capable of assuming either a set or reset state, explained in more detail hereinafter. The phase change memory element 18a may include an insulator 62, a phase change memory material 64, a top electrode 66, and a barrier film 68, in one embodiment of the present invention. A lower electrode 60 may be defined within the insulator 62 in one embodiment of the present invention.

In one embodiment, the phase change material 64 may be a phase change material suitable for non-volatile memory data storage. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material 64 may be chalcogenide element composition from the class of tellurium-germanium-antimony ($Te_xGe_ySb_z$) material or a GeSbTe alloy (such as x=2, y=2, z=5), although the scope of the present invention is not limited to just these materials.

In one embodiment, if the memory material 64 is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material 64 in the substantially amorphous state is greater than the resistance of the memory material in the substantially crystalline state. Accordingly, in this embodiment, the memory material 64 may be adapted to be altered to a particular one of a number of resistance values within a range of resistance values to provide digital or analog storage of information.

Programming of the memory material to alter the state or phase of the material may be accomplished by applying voltage potentials to the lines 52 and 54 or forcing a current of adequate amplitude to melt the material, thereby generating a voltage potential across the memory material 64. An electrical current may flow through a portion of the memory material 64 in response to the applied voltage potentials or current forced, and may result in heating of the memory material 64.

This heating and subsequent cooling may alter the memory state or phase of the memory material 64. Altering the phase or state of the memory material 64 may alter an electrical characteristic of the memory material 64. For example, resistance of the material 64 may be altered by altering the phase of the memory material 64. The memory material 64 may also be referred to as a programmable resistive material or simply a programmable resistance material.

In one embodiment, a voltage potential difference of about 0.5 to 1.5 volts may be applied across a portion of the memory material by applying about 0 volts to a line 52 and about 0.5 to 1.5 volts to an upper line 54. A current flowing through the memory material 64 in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material 64 may be heated to a relatively higher temperature to amorphisize memory material and "reset" memory material. Heating the volume or memory material to a relatively lower crystallization temperature may crystallize memory material and "set" memory material. Various resistances of memory material may be achieved to store more than one logical bit in one physical bit by varying the amount of current flow and duration through the volume of memory material. Alternatively, the bit may be written by tailoring the edge rate of the trailing edge of the programming current or voltage pulse, such as by using a trailing edge rate of less than 100 nsec to reset the bit or a trailing edge greater than 500 nsec to set the bit.

The information stored in memory material 64 may be read by measuring the resistance of the memory material. As an example, a read current may be provided to the memory material using opposed lines 54, 52 and a resulting read voltage across the memory material may be compared against a reference voltage using, for example, the sense amplifier 20. The read voltage above the selection device (such as an ovonic threshold switch, diode, or MOS transistor) may be proportional to the resistance exhibited by the memory storage element.

In order to select a cell MC on column 54 and row 52, the selection device 18*b* for the selected cell MC at that location may be operated. The selection device 18*b* activation allows current to flow through the memory element 18*a* in one embodiment of the present invention.

In a low voltage or low field regime A, the device 18*b* is off and may exhibit very high resistance in some embodiments. The off resistance can, for example, range from 100,000 ohms to greater than 10 gigaohms at a bias of half the threshold voltage, such as about 0.4V. The device 18*b* may remain in its off state until a threshold voltage $V_T$ or threshold current $I_T$ switches the device 18*b* to a highly conductive, low resistance selected on state. The voltage across the device 58 after turn on drops to a slightly lower voltage relative to V threshold, called the holding voltage $V_H$ plus the current forced times the dynamic resistance of the "on" selection device. In one embodiment of the present invention, as an example, the threshold voltage may be on the order of 1.1 volts and the holding voltage may be on the order of 0.9 volts, and the dynamic resistance may be 500 ohms.

After passing through the snapback region, in the on state, the device 18*b* voltage drop remains close to the holding voltage as the current passing through the device is increased up to a certain, relatively high, current level for writing or relatively low current for reading. Above that current level the device remains on but displays a finite differential resistance with the voltage drop increasing with increasing current. The device 18*b* may remain on until the current through the device 18*b* is dropped below a characteristic holding current value that is dependent on the size and the material utilized to form the device 18*b*.

In some embodiments of the present invention, the selection device 18*b* does not change phase. It remains permanently amorphous and its current-voltage characteristics may remain the same throughout its operating life.

As an example, for a 0.5 micrometer diameter device 18*b* formed of TeAsGeSSe having respective atomic percents of 16/13/15/1/55, the holding current may be on the order of 0.1 to 100 micro-amps in one embodiment. Below this holding current, the device 18*b* turns off and returns to the high resistance regime at low voltage, low field. The threshold current for the device 18*b* may generally be of the same order as the holding current and preferably greater than the holding current to avoid oscillations depending on read bias point. The holding current may be altered by changing process variables, such as the top and bottom electrode material and the chalcogenide material. The device 18*b* may allow a relatively high "on current" for a given area of device and voltage across it compared to conventional access devices such as metal oxide semiconductor field effect transistors or bipolar junction transistors or diodes.

In some embodiments, the higher current density of the device 18*b* in the on state allows for higher programming current available to the memory element 18*a* at reduced array voltages. Where the memory element 18*a* is a phase change memory, this enables the use of larger programming current phase change memory devices, reducing the need for sub-lithographic feature structures and the commensurate process complexity, cost, process variation, and device parameter variation.

One technique for addressing the array 12 uses a voltage V applied to the unselected column and rows, with zero voltage applied to the selected row. For the case where the device 56 is a phase change memory, the voltage V is chosen to be greater than or equal to the device 18*b* minimum threshold voltage, but less than two times the device 18*b* minimum threshold voltage. In other words, the maximum threshold voltage of the device 18*b*, and the maximum holding voltage of device 18*b* plus the maximum reset threshold voltage of the device 18*a* may be less than 2V. All of the unselected rows and columns may be biased at V/2.

With this approach, there is no bias voltage between the unselected rows and unselected columns. This reduces and minimizes background and standby leakage current.

After biasing the array in this manner, the memory elements 18*a* may be programmed and read by whatever means is needed for the particular memory technology involved, the dynamic resistances of the select device 18*b* and memory 18*a* are low enough so that the memory is above to be written in less than 2V volts. A memory element 18*a* that uses a phase change material may be programmed by forcing the current needed for memory element phase change or the memory array can be read by forcing a lower current to determine the device 18*a* resistance.

For the case of a phase change memory element 18*a*, programming a given selected bit in the array 105 can be as follows. Unselected rows and columns may be biased as described for addressing, such as at V. Zero volts is applied to the selected row. A current is forced on the selected column with a voltage compliance that is greater than the maximum threshold voltage of the device 18b, and equal to the maximum holding voltage plus the maximum threshold voltage of the device 18a plus margin to allow write. The current amplitude, duration, and pulse shape may be selected to place the memory element 18a in the desired phase and thus, the desired memory state. Preferably, the write pulse is terminated with a fast edge rate less than 10 nsec to write a reset bit and a slow edge rate greater than 200 nsec to write a set bit.

Reading a phase change memory element 18a can be performed as follows. Unselected rows and columns may be biased as described previously at V. Zero volts is applied to the selected row. A voltage is forced at a value greater than the maximum threshold voltage of the device 18b, but less than the minimum holding voltage of the device 18b plus the minimum threshold voltage of the element 18a on the selected column. The current compliance of this forced voltage is less than the current that could program or disturb the set phase of the memory element 18a. If the phase change memory element 18a is set, the access device 18b switches on and presents a low voltage, high current condition to a sense amplifier. If the device 18a is reset, a larger voltage, lower current condition may be presented to the sense amplifier. The sense amplifier can either compare the resulting column voltage to a reference voltage or compare the resulting column current to a reference current.

The above-described reading and programming protocols are merely examples of techniques that may be utilized. Other techniques may be utilized by those skilled in the art.

To avoid disturbing a set bit of memory element 18a that is a phase change memory, the peak current may equal the threshold voltage of the device 18b minus the holding voltage of the device 18b, that quantity divided by the total series resistance including the resistance of the device 18b, external resistance of device 18a, plus the set resistance of device 18a. This value may be less than the maximum programming current that will begin to reset a set bit for a short duration pulse.

Figure 5:
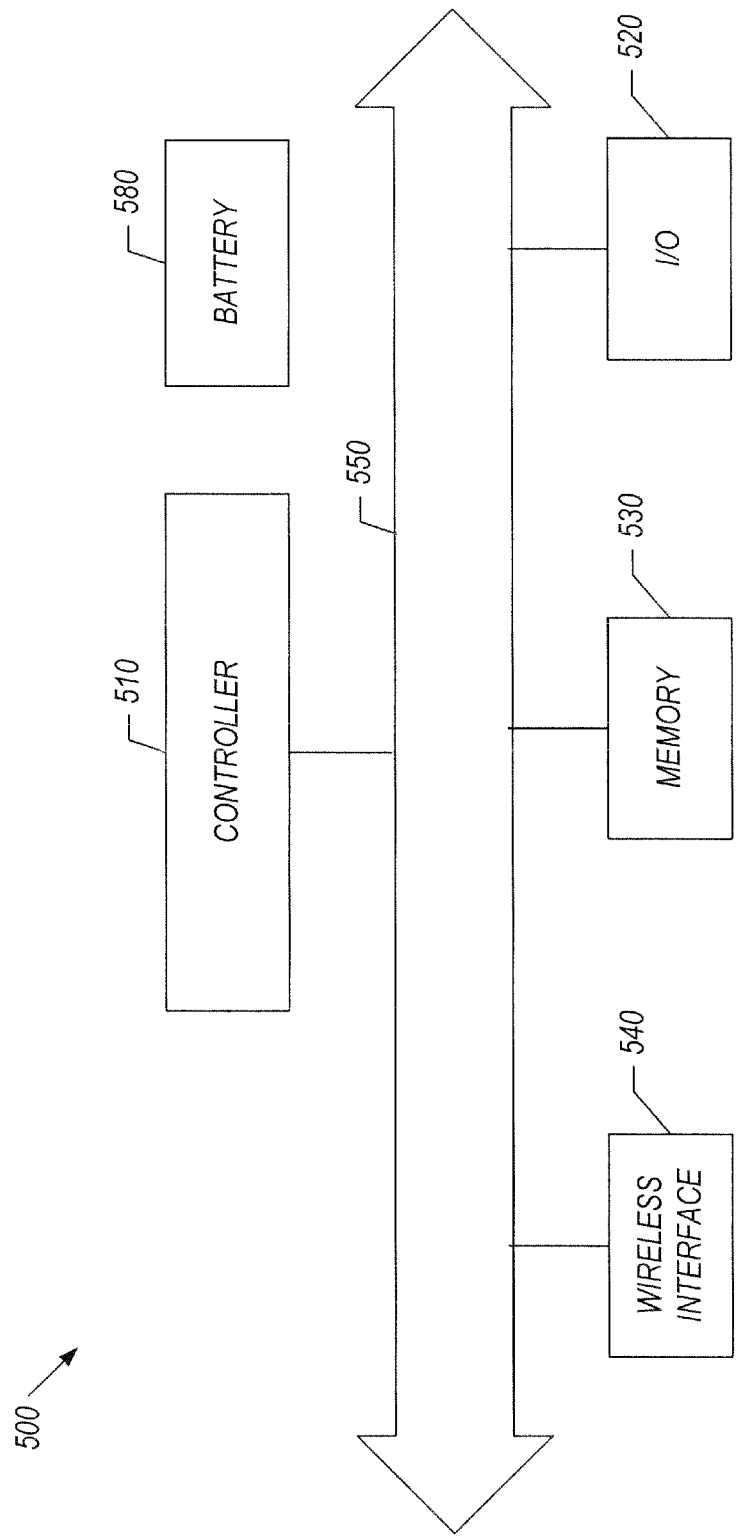
FIG. 5 is a system depiction of one embodiment of the present invention.

Turning to FIG. 5, a portion of a system 500 in accordance with an embodiment of the present invention is described. System 500 may be used in wireless devices such as, for example, a cellular telephone, personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540, coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or phase change memory that includes a memory element 18a such as, for example, memory 100 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A non-transitory computer readable medium storing instructions that, if executed, enable a processor-based system to:
   detect an incorrect bit read by an operating phase change memory;
   correct the bit on its way to be output while deferring writing the corrected bit back to the memory;
   detect a memory power cycle; and
   repair said incorrect bit, by writing it back memory, using error correcting code during the memory power cycle.

2. The medium of claim 1 further storing instructions that, if executed, enable the processor-based system to correct an incorrect bit by writing back a correct bit.

3. The medium of claim 2 further storing instructions that, if executed, enable the processor-based system to wait until a power cycle to write back a corrected bit.

4. The medium of claim 1 further storing instructions that, if executed, enable the processor-based system to executed error correcting code.

5. The medium of claim 4 further storing instructions that, if executed, enable the processor-based system to identify errors using a Hamming code.

* * * * *